United States Patent
Gisler et al.

(10) Patent No.: US 11,231,559 B2
(45) Date of Patent: Jan. 25, 2022

(54) INSPECTION DEVICE FOR INSPECTING A CABLE END OF A CABLE AND A METHOD FOR CLEANING

(71) Applicant: KOMAX HOLDING AG, Dierikon (CH)

(72) Inventors: Adrian Gisler, Eschenbach (CH); Markus Kiser, Büren (CH); Martin Stocker, Küssnacht (CH)

(73) Assignee: KOMAX HOLDING AG, Dierikon (CH)

( * ) Notice: Subject to any disclaimer, the term of this patent is extended or adjusted under 35 U.S.C. 154(b) by 238 days.

(21) Appl. No.: 16/511,585

(22) Filed: Jul. 15, 2019

(65) Prior Publication Data

US 2020/0049942 A1 Feb. 13, 2020

(30) Foreign Application Priority Data

Aug. 13, 2018 (EP) ..................... 18188622

(51) Int. Cl.

| | |
|---|---|
| *G02B 7/182* | (2021.01) |
| *G01R 31/58* | (2020.01) |
| *G01R 31/66* | (2020.01) |
| *G02B 5/09* | (2006.01) |
| *G02B 27/00* | (2006.01) |

(52) U.S. Cl.
CPC .............. *G02B 7/182* (2013.01); *G01R 31/58* (2020.01); *G01R 31/66* (2020.01); *G02B 5/09* (2013.01); *G02B 27/0006* (2013.01)

(58) Field of Classification Search
CPC ...... G02B 7/182; G02B 5/09; G02B 27/0006; G02B 13/06; G02B 27/143; G01R 31/58; G01R 31/66; G01R 31/69; H01R 43/28; H01R 43/05; G01N 21/952; G01N 21/8806; B08B 5/02
USPC ......................................................... 359/855
See application file for complete search history.

(56) References Cited

U.S. PATENT DOCUMENTS

2003/0058555 A1* 3/2003 Takino ................... G02B 7/182
359/850
2016/0377555 A1* 12/2016 Ray ........................ H01R 43/05
356/237.2

FOREIGN PATENT DOCUMENTS

| EP | 1296162 A1 | 3/2003 |
|---|---|---|
| EP | 3109624 A1 | 12/2016 |

\* cited by examiner

*Primary Examiner* — Euncha P Cherry
(74) *Attorney, Agent, or Firm* — William J. Clemens; Shumaker, Loop & Kendrick, LLP

(57) ABSTRACT

An inspection apparatus for inspecting a cable end of a cable, with and without a connected crimp contact, includes a mirror apparatus with a central axis along which the cable end can be arranged for checking the cable end. The mirror apparatus includes a plurality of mirror elements arranged at a predetermined angle to each other and arranged at a predetermined angle to the central axis, each mirror element having a mirror arranged along the central axis for viewing the cable end from a different viewpoint. The inspection apparatus includes a camera for generating images of the cable end from the different viewing angles of the mirrors. At least a portion of each of the mirror elements is held in a respective position in the mirror apparatus by magnets.

17 Claims, 7 Drawing Sheets

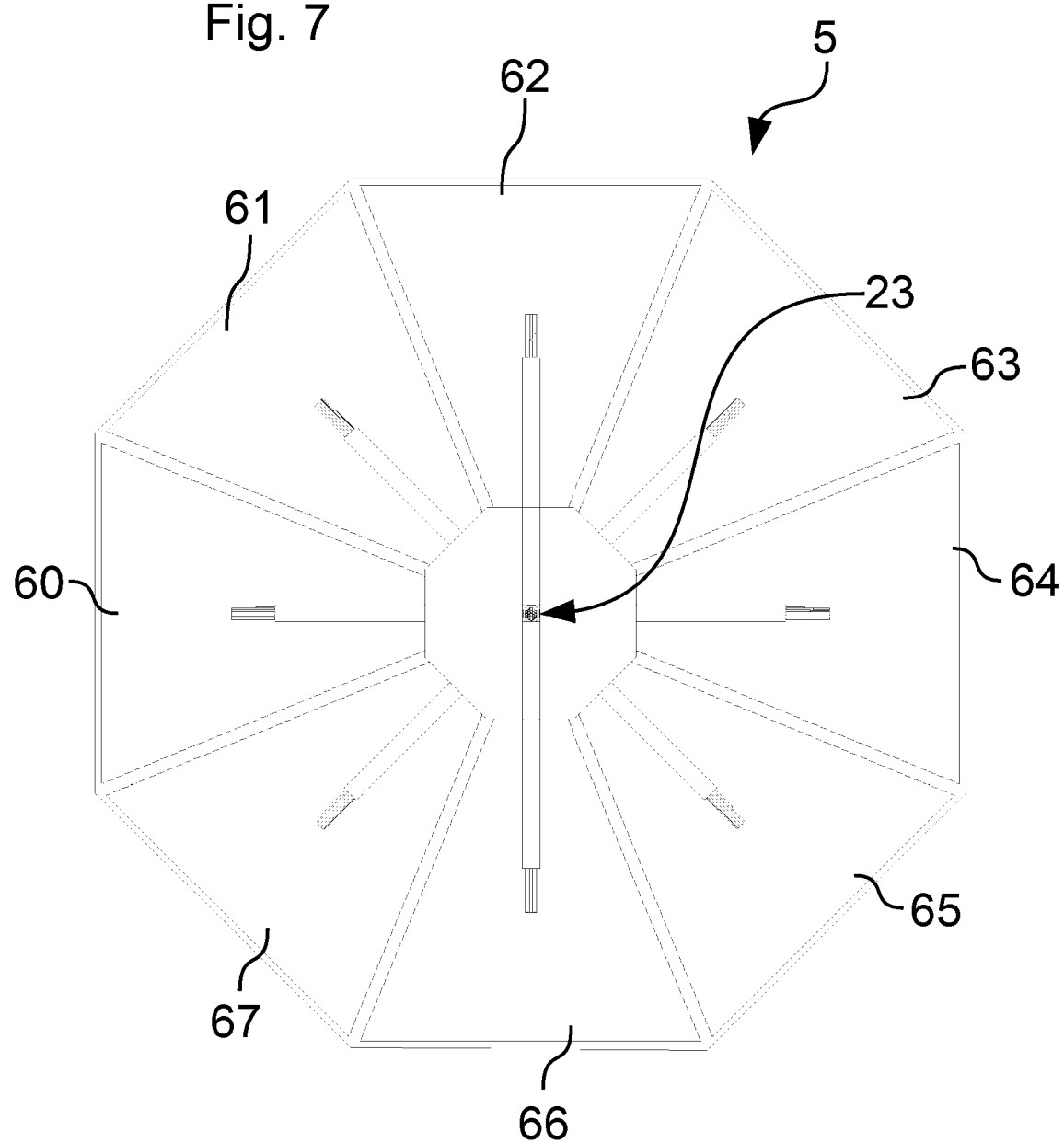

INSPECTION DEVICE FOR INSPECTING A CABLE END OF A CABLE AND A METHOD FOR CLEANING

FIELD

The present invention relates to an inspection apparatus for inspecting a wire end of a cable and a method for cleaning the mirror of an inspection apparatus.

BACKGROUND

EP 3 109 624 A1 describes an inspection apparatus for inspecting a cable end segment, including an exposed conductor, of a cable according to the prior art. The inspection apparatus in EP 3 109 624 A1 comprises a camera, a lighting device and a conical mirror collar (i.e. a conical arrangement of individual mirrors about a central axis). To inspect the cable segment or perform a quality check, a cable segment is inserted into the conical mirror collar, where a camera records the mirror images of the cable segment. This recording is evaluated with software, i.e. the cable segment is checked for quality. The test takes place before and after crimping to verify the quality of the stripping and the connection of the crimp contact to the cable (i.e. the crimped connection). This can be done by inserting the cable segment twice into a single inspection apparatus or by using two separate inspection apparatuses.

One aspect of inspection apparatuses to be considered is the contamination of parts of the inspection apparatus, in particular the camera and/or the mirror, with dirt and/or dust, in particular of the cable to be inspected, which can lead to errors in the quality check by means of the camera. Without the cleaning of the mirror, the inspection of the cable segment by means of the inspection apparatus is no longer reliably possible even after one day, under unfavorable circumstances.

EP 3 109 624 A1 proposes to reduce contamination by placing the elements of the inspection apparatus (i.e. camera, lighting device and conical mirror collar) in a housing in which an overpressure is generated. This is to prevent penetration of dirt particles into the housing.

A disadvantage of previously known inspection apparatuses is that the mirrors are clamped and/or laboriously glued to a mirror support, wherein the orientation of the mirror must be observed or adjusted. In this case, the intermediate layer of adhesive between mirror and mirror support or mirror apparatus is particularly problematic. Since mostly the entire contact surface between the mirror apparatus or mirror support and mirror is used for bonding, mechanical stresses in the mirror may arise through the different thermal expansions of different materials (adhesive, mirror, mirror support or mirror apparatus). This can lead to visual impairments when viewing the reflections of the mirrors and/or damage to the mirrors.

In addition, the mirror supports have previously been bolted to the mirror apparatus. When cleaning the mirrors outside the inspection apparatus, which is necessary from time to time, the mirror collar or mirror apparatus is handled or held in its entirety, since the mirror supports are fastened to the mirror apparatus by means of screws. Also, re-attaching or re-aligning the mirror in the mirror apparatus after releasing or removing a single mirror support is technically laborious. In addition, the mirror supports by means of which the mirrors are fastened and aligned in the mirror apparatus are often very heavy, so that the handling of the mirrors (with the mirror support) is difficult or laborious when cleaning the mirrors.

There may be, among other things, a need for an inspection apparatus for inspecting a cable segment of a cable, in which the insertion and/or removal of mirrors of the inspection apparatus is technically simple to carry out. In addition, among other things, there may be a need for a method for cleaning the mirrors of an inspection apparatus, by means of which the mirrors are technically easily cleaned, and the mirrors are technically easily inserted into the inspection apparatus after cleaning.

SUMMARY

Such a need can be met by an inspection apparatus for inspecting a cable end of a cable and a method for cleaning the mirrors of an inspection apparatus according to the advantageous embodiments of the invention as described herein.

According to a first aspect of the invention, an inspection apparatus is proposed for inspecting a cable end of a cable, in particular a processed cable, preferably a cable connected with a crimp contact via a crimp connection, wherein the inspection apparatus comprises a mirror apparatus with a central axis, wherein the cable end for inspection can be arranged along the central axis in the mirror apparatus, wherein the mirror apparatus comprises a plurality of mirror elements arranged at a predetermined angle to each other and arranged at a predetermined angle to the central axis, each comprising a mirror for viewing the cable end arranged along the central axis of the mirror apparatus from different angles, wherein the inspection apparatus further comprises a camera for generating images of the cable end from different angles by means of the mirror, characterized in that at least a part of the mirror elements, in particular all mirror elements, are held in the mirror apparatus by magnets at their respective position.

The advantage of this is that the mirror elements or the mirror are typically kept in each case in their position in a technically simple manner. In addition, the connection between the mirror apparatus and the mirror elements or mirrors can generally be released in a non-destructive or technically simple, reversible manner and easily restored. In particular, the mirror elements can usually be removed from the mirror apparatus, for example for cleaning, and re-inserted in the mirror apparatus. Moreover, the occurrence of mechanical stresses in the mirrors is typically technically easily prevented. In addition, the mirror elements can typically be technically easily aligned with respect to the mirror apparatus. The mirror elements can also usually have a low weight, whereby the handling of the mirror elements is particularly simple. The mirror elements can usually be removed from the mirror apparatus in a technically simple manner, as a result of which the cleaning process is generally technically even simpler.

According to a second aspect of the invention, a method for cleaning the mirrors of an inspection apparatus for inspecting a cable end of a cable, in particular an inspection apparatus as described above, is proposed, wherein the inspection apparatus comprises a mirror apparatus with a central axis, wherein, for inspecting the cable end, the cable end can be arranged along the central axis in the mirror apparatus, wherein the mirror apparatus comprises a plurality of mirror elements arranged at a predetermined angle to each other and arranged at a predetermined angle to the central axis, each comprising a mirror for viewing the cable end arranged along the central axis of the mirror apparatus from different angles, wherein the inspection apparatus further comprises a camera for generating images of the cable end from different angles by means of the mirror. The method comprises the following steps: removing the mirror apparatus from the inspection apparatus; releasing a magnetic connection between at least one of the mirror elements and the mirror apparatus and removing the at least one mirror element from the mirror apparatus; cleaning the mirror of the at least one mirror element; inserting the cleaned at least one mirror element in the mirror apparatus in a predetermined position and attaching the mirror element to the mirror apparatus by means of a magnet; and inserting the mirror apparatus into the inspection apparatus.

As a result, cleaning the mirror elements is typically technically simple. In particular, usually no connection must be released in a technically laborious manner (e.g. a screw connection) in order to remove the mirror elements of the mirror apparatus. In addition, the mirror elements are typically reinserted into the mirror apparatus in a technically simple manner. In addition, the occurrence of mechanical stresses in the mirrors is generally prevented in a technically simple manner. Thus, the cleaning process is technically particularly simple to carry out. The mirror elements can also usually have a low weight, whereby the handling of the mirror elements is particularly simple. The mirror elements can usually be removed from the mirror apparatus in a technically simple manner, as a result of which the cleaning process is generally technically even simpler. In addition, the mirror elements may generally be formed to be insensitive to shocks or the like. In particular, the person undertaking the cleaning may typically focus on removing the mirrors or mirror elements of the mirror apparatus, since the mirror elements are held via the magnets (and thus the release of the mirror elements from the mirror apparatus is technically simple) and the mirror elements may have a low weight (and thus the handling of the mirror elements is particularly simple).

Possible features and advantages of embodiments of the present invention may be considered, inter alia and without limiting the invention, to be dependent upon the concepts and findings described below.

According to one embodiment of the inspection apparatus, the mirror elements furthermore each have a plate, in particular a metal plate, wherein the mirrors are each firmly connected to the plate, in particular by means of an adhesive bond, wherein the plates each comprise such a material that the plates can be attracted by magnets. The advantage of this is that the mirrors can be connected with the mirror apparatus in a technically simple manner and in a predetermined position.

According to one embodiment of the inspection apparatus, the plates each comprise one or more adhesive recesses for receiving an adhesive of the adhesive bond. An advantage of this is that the mirrors can be arranged particularly precisely parallel to the respective plate.

According to one embodiment of the inspection apparatus, the respective plate in the adhesive recess has a chamfer on one end facing away from the mirror for improved bonding of the adhesive to the plate. In this way, the connection between the plate and the adhesive can be improved or made even more secure.

According to one embodiment of the inspection apparatus, the respective size of the contact surface of the adhesive with the respective mirror substantially corresponds to a diameter of the respective adhesive recess for receiving the adhesive parallel to the surface of the plate. The advantage of this is that any expansion and/or shrinkage of the plate and/or the mirror and/or the adhesive due to temperature changes does not adversely affect the connection between the plate and the respective mirror. Since the connection between the plate and the respective mirror exists only over a surface corresponding to the diameter of the adhesive recess, the occurrence of mechanical stresses or even bending of the mirror and/or the plate by temperature changes is substantially prevented. This ensures that the surface of the respective mirror always runs parallel to the surface of the plate.

According to one embodiment of the inspection apparatus, the mirror apparatus comprises support surfaces for resting mirror back surfaces of the mirrors of the mirror elements, wherein the support surfaces each have a recess for receiving the respective plate. The advantage of this is that the mirrors are technically easily aligned so that, after insertion, the respective mirror is aligned relative to the central axis and the other mirrors in a technically simple manner without further measures. Thus, the mirror is held or positioned in a first direction at a predetermined location, since the respective mirror or the respective mirror element cannot move substantially in a direction perpendicular to the respective support surface.

According to one embodiment of the inspection apparatus, stops are arranged on the ends of the plates facing away from the central axis of the inspection apparatus for holding each of the mirror elements in a respective predetermined position in the mirror apparatus. As a result, a sliding down or moving of the respective mirror element away from the central axis and parallel to a support surface of the mirror, on which the mirror rests with its mirror back surface, is prevented in a technically easy manner. Thus, the mirror or the mirror element is held or positioned in a second direction at a predetermined location.

According to one embodiment of the inspection apparatus, the mirror apparatus has a plurality of lateral mirror boundaries, wherein the lateral mirror boundaries are respectively arranged in a predetermined position on two opposite sides of the respective mirror for holding the respective mirror. The advantage of this is that the mirrors are held on two (further) sides in their respective predetermined position. Thus, the mirror is held or positioned in a third direction at a predetermined location. Together with the stop and the support surface, the respective mirror element and consequently the respective mirror are held or aligned relative to the central axis at the predetermined position in all three spatial dimensions.

According to one embodiment of the inspection apparatus, the inspection apparatus is designed to make the mirror apparatus removable from the inspection apparatus and insertable in the inspection apparatus. The advantage of this is that it is technically very simple to remove the mirror elements or mirrors from the mirror apparatus. In addition, the mirror elements or mirrors can be technically easily re-inserted into the mirror apparatus. In addition, the mirror apparatus can be technically easily replaced with another mirror apparatus or changed.

According to one embodiment of the inspection apparatus, the plates of the mirror elements are arranged spaced away from the magnets. As a result, the mirrors are even more precisely aligned with the central axis. In addition, expansion and/or shrinkage due to temperature changes do not create mechanical stresses in the mirror element or plate. This leads to a particularly reliable alignment of the mirror elements or mirrors relative to the central axis.

According to one embodiment of the inspection apparatus, each of the mirrors has a trapezoidal shape in a top view, and one end of the plate is flush with the shorter of the two parallel sides of the mirror. This allows the mirrors to be aligned with particular precision. In addition, the plate can be aligned particularly precisely relative to the mirror.

According to one embodiment of the inspection apparatus, the mirror apparatus is formed mirror-symmetrically with respect to the central axis. The advantage of this is that the orientation of the mirror apparatus when inserted into the inspection apparatus is typically irrelevant. Thus, the mirror apparatus can generally be inserted into the inspection apparatus without checking a specific orientation of the mirror apparatus with respect to the central axis. This usually makes it easier to use the mirror apparatus.

According to one embodiment of the inspection apparatus, each mirror element is attached to the mirror apparatus by means of two magnets, the magnets being arranged in depressions of the recess. The advantage of this is that the mirror apparatus can typically be very compact. In addition, the mirror elements are generally particularly reliably attached to the mirror apparatus.

According to one embodiment of the method, the method also comprises the following step: Attaching at least one mirror element to a mirror holding apparatus using magnets to hold the mirror element while cleaning the mirror. The advantage of this is that the mirror elements are typically held in a technically simple manner during the cleaning process.

It should be noted that some of the possible features and advantages of the invention are described herein with reference to different embodiments. A person skilled in the art recognizes that the features can be combined, adapted or replaced as appropriate in order to arrive at further embodiments of the invention.

Embodiments of the invention will be described below with reference to the accompanying drawings, with neither the drawings nor the description being intended to be interpreted as limiting the invention.

DESCRIPTION OF THE DRAWINGS

FIG. 7 shows an image of the cable end captured with the inspection apparatus from FIG. 1.

The drawings are merely schematic and not true to scale. Like reference signs refer to like or equivalent features in the various drawings.

DETAILED DESCRIPTION

Figure 1:
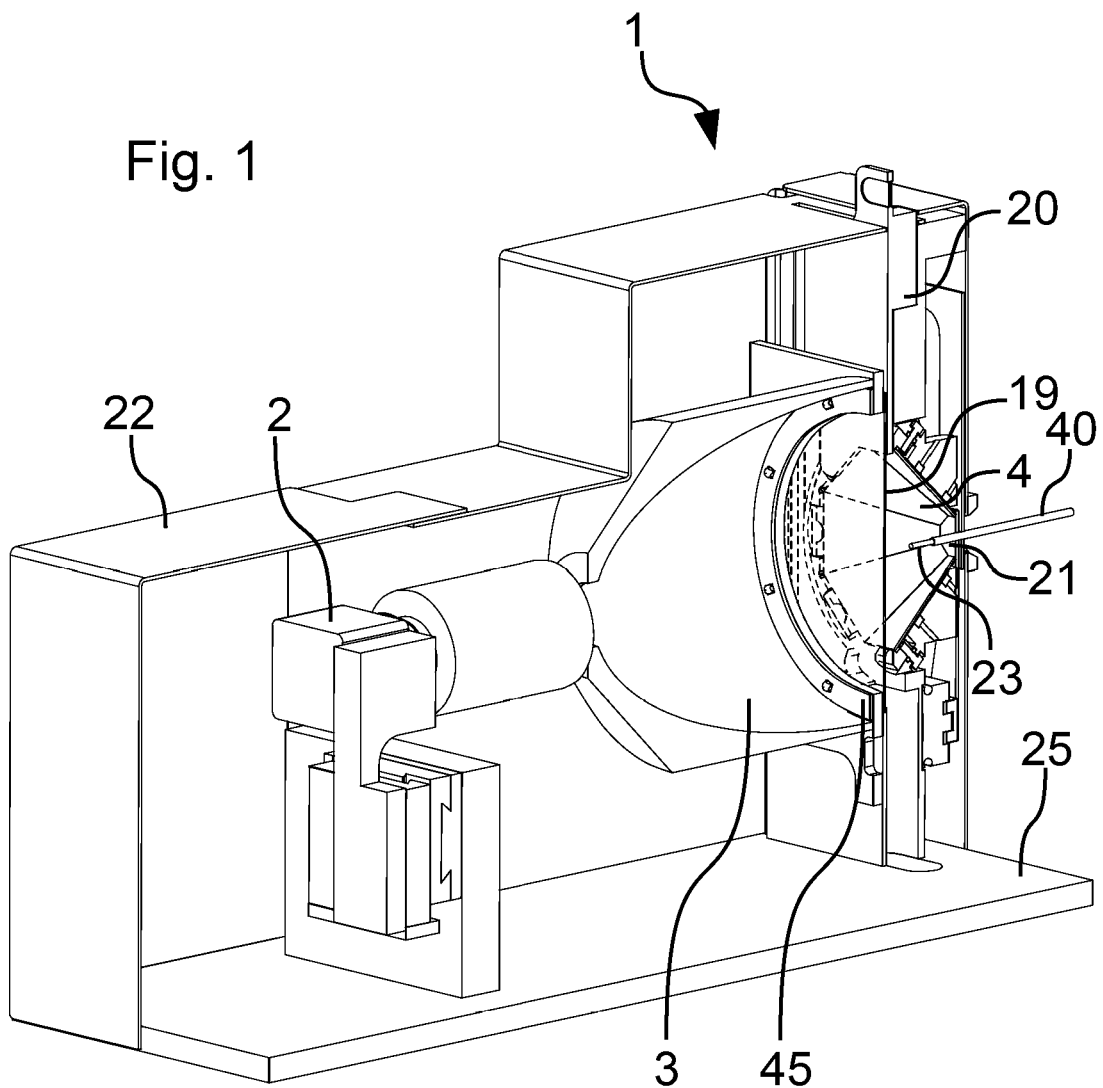
FIG. 1 shows a perspective partial sectional view of one embodiment of the inventive inspection apparatus.
Figure 2:
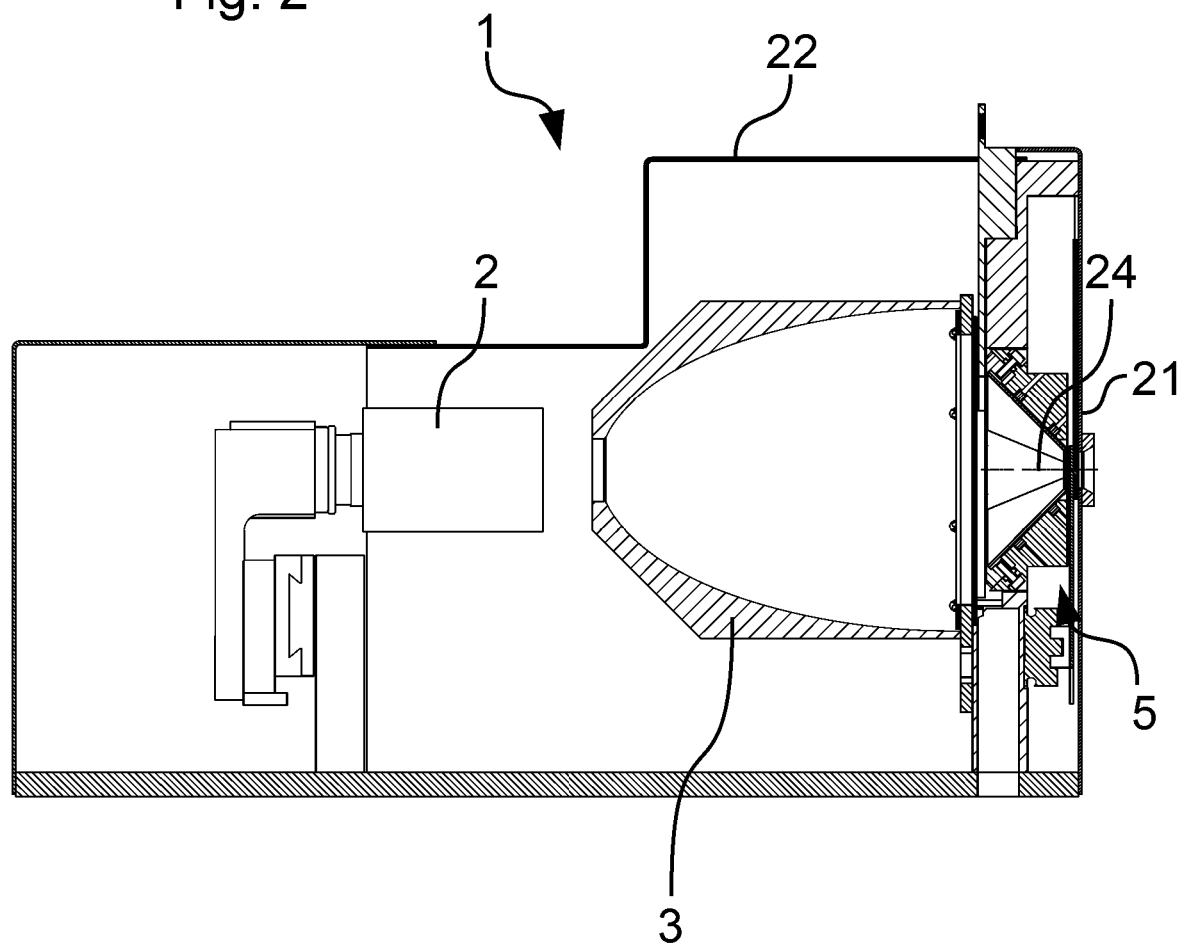
FIG. 2 shows a side sectional view of the inspection apparatus from FIG. 1.

FIG. 1 shows a perspective partial sectional view of one embodiment of the inventive inspection apparatus. FIG. 2 shows a side sectional view of the inspection apparatus from FIG. 1.

The inspection apparatus 1 is designed to inspect or examine a cable end 23 of a cable 40. For this purpose, the inspection apparatus 1 has a mirror apparatus 5, a lighting device 3 and a camera 2 mounted on a support base 25.

The cable 40 or the cable end 23 is introduced into the mirror apparatus 5 through a cable receiving opening 30 (FIG. 3) and along a central axis 24 of the mirror apparatus 5, wherein the central axis 24 runs horizontally. The cable 40 is held in this position using a cable centering 21. The central axis 24 runs midway through the cable receiving opening 30 of the mirror apparatus 5.

The cable centering 21 has a first vertically moving parallel gripper which can move two clamp plates towards each other, and a second horizontally moving parallel gripper which can also move two clamp plates towards each other. The four clamp plates hold the cable 40 and center it at the same time, so that the cable 40 or the cable end 23 runs along the central axis 24 in the mirror apparatus 5.

The mirror apparatus 5 comprises a plurality of mirrors 60-67 (FIG. 7) in the form of a mirror collar 4 around the central axis 24 or the cable end 23.

The mirrors 60-67 of the mirror apparatus 5 are arranged at an equal angle to each other and completely surround the central axis 24. For example, the mirror apparatus 5 can comprise eight mirrors 60-67, so that each mirror 60-67 is aligned at an angle of 360°/8=45° to the immediately adjacent mirror 60-67. It is also conceivable that the mirror apparatus 5 comprises only five or six mirrors 60-67 which completely surround the cable end 23.

In addition, the mirrors 60-67 are arranged in such a way that they run conically towards the cable receiving opening 30, i.e. the distance of mirrors 60-67 from the central axis 24 becomes smaller the more one moves towards the cable receiving opening 30.

The mirrors 60-67 each have an angle of about 45° to the central axis 24. The mirrors 60-67 are each trapezoidal in a top view. The thickness of the mirror 60-67, which runs in the direction of the top view, is small compared to the dimensions of the trapezoid of the mirror 60-67.

One or several mirrors 60-67 can each have distance markings to serve as a reference for measurement operations in the evaluation of the images taken by the camera 2.

A transparent pane 19 separates the camera 2 and the lighting device 3 on a first side of the pane 19 from the mirror apparatus 5 on a second side of the pane 19. Pane 19 runs vertically.

The mirror apparatus 5, the pane 19 and the cable centering 21, which almost completely closes the cable receiving opening 30, together limit the inside or interior space of the mirror apparatus 5.

Lighting device 3 includes a reflector in the form of a rotational paraboloid, which has a view opening for the camera 2. In FIG. 2, the view opening is on the left, i.e. the side of the reflector or lighting device 3 turned away from the mirror apparatus 5.

Lighting device 3 also includes a ring light 45. The ring light 45 is arranged at the inner edge of the reflector at the end facing the mirror apparatus 5 (in FIG. 2 the right end) of the reflector. Lighting device 3, or ring light 45, is disc-shaped and has a plurality of light sources, such as LEDs, which are evenly distributed over the perimeter of the lighting device 3. The light sources are arranged in such a way that their main radiation direction is parallel to the central axis 24 away from the mirror apparatus 5. This brings the radiated light to the reflector and then to the cable end 23, which is illuminated from many sides.

The reflector or inner surface of the reflector may have a white plastic (e.g. polytetrafluorethylene (PTFE) or polyoxymethylene (POM)) and/or a white surface or color layer. The inner surface, which is formed to reflect the light from the light sources, is designed to be rough to achieve a good scattering of light. The light sources all radiate towards the reflector.

The viewing direction of the camera 2 runs along the central axis 24. The camera 2 takes images or pictures of the cable end 23 from different angles via reflections of the mirrors 60-67, which are arranged around the cable end 23. The number of viewing angles depends on the number of mirrors 60-67. It is also possible that the camera 2 only captures one image, which is then divided or is already divided into several images, namely one image per mirror 60-67. It is also possible that, for each mirror 60-67, a separate image will be taken by the camera 2 or several cameras.

The camera 2 is connected to an evaluation system (not shown). The evaluation system includes, for example, a computer with evaluation software, wherein the evaluation software analyzes the images of the cable end 23 from different angles. The evaluation software may comprise or may be image recognition software. The evaluation software can detect, for example, imbalances and/or asymmetries and/or other errors, such as pulled out and/or splayed strands of the cable 40 or the cable end 23. If one or more errors and/or quality defects have been detected by the evaluation software, a corresponding error message can be generated. For example, the cable 40 can be disposed of as scrap following the error message, the production of further cables can be temporarily stopped until manual release or the like. A pure recording of the identified variables can also take place.

The cable 40 can be analyzed or inspected or examined using the inspection apparatus 1 before and/or after processing the cable 40 with a cable processing machine (e.g. a crimp machine) in order to determine changes made in the cable 40 by the cable processing machine.

The camera 2 can be a digital photo camera or digital video camera.

A transparent pane 19, which runs vertically to the central axis 24, is arranged between the reflector or lighting device 3 and the mirror apparatus 5. The pane 19 separates, in particular in an essentially airtight manner, the mirror apparatus 5 from the reflector or the lighting device 3 and the camera 2. Thus, no dirt and/or debris from the mirror apparatus 5 or from the cable 40 or the cable end 23 can enter the reflector and/or the camera 2. The mirror apparatus 5 and the reflector/the camera 2 are thus located on two opposite sides of the pane 19.

A housing 22 of the inspection apparatus 1 encloses the components or parts of the inspection apparatus 1 (i.e. camera 2, reflector, pane 19 and mirror apparatus 5), so that they are protected from dust and/or dirt. With the housing 22 closed on the support base 25, only the cable receiving opening 30 remains, through which dust and/or dirt can penetrate the inspection apparatus 1.

The inspection apparatus 1 also includes a compressed air cleaning apparatus 20. The compressed air cleaning apparatus 20 is designed to clean the pane 19 and the mirror apparatus 5 of dirt and/or debris using compressed air.

The compressed air cleaning apparatus 20 is used to clean the pane 19 and the mirror 60-67 with compressed air. If the compressed air cleaning apparatus 20 is used in the inspection apparatus 1, the compressed air cleaning apparatus 20 or the outlets of the compressed air cleaning apparatus 20 are fluidly connected to a stationary compressed air channel.

The compressed air cleaning apparatus 20 can be taken from the inspection apparatus 1 and inserted back into it. For this purpose, the inspection apparatus 1 has a recess, into which a calibration element or a gray card can also be inserted to calibrate the (color) camera 2.

Camera 2, lighting device 3, pane 19 and mirror apparatus 5 are arranged or enclosed in a one-piece or multi-part cover 22 to prevent the penetration of dust and/or dirt or at least to reduce it.

Figure 3:
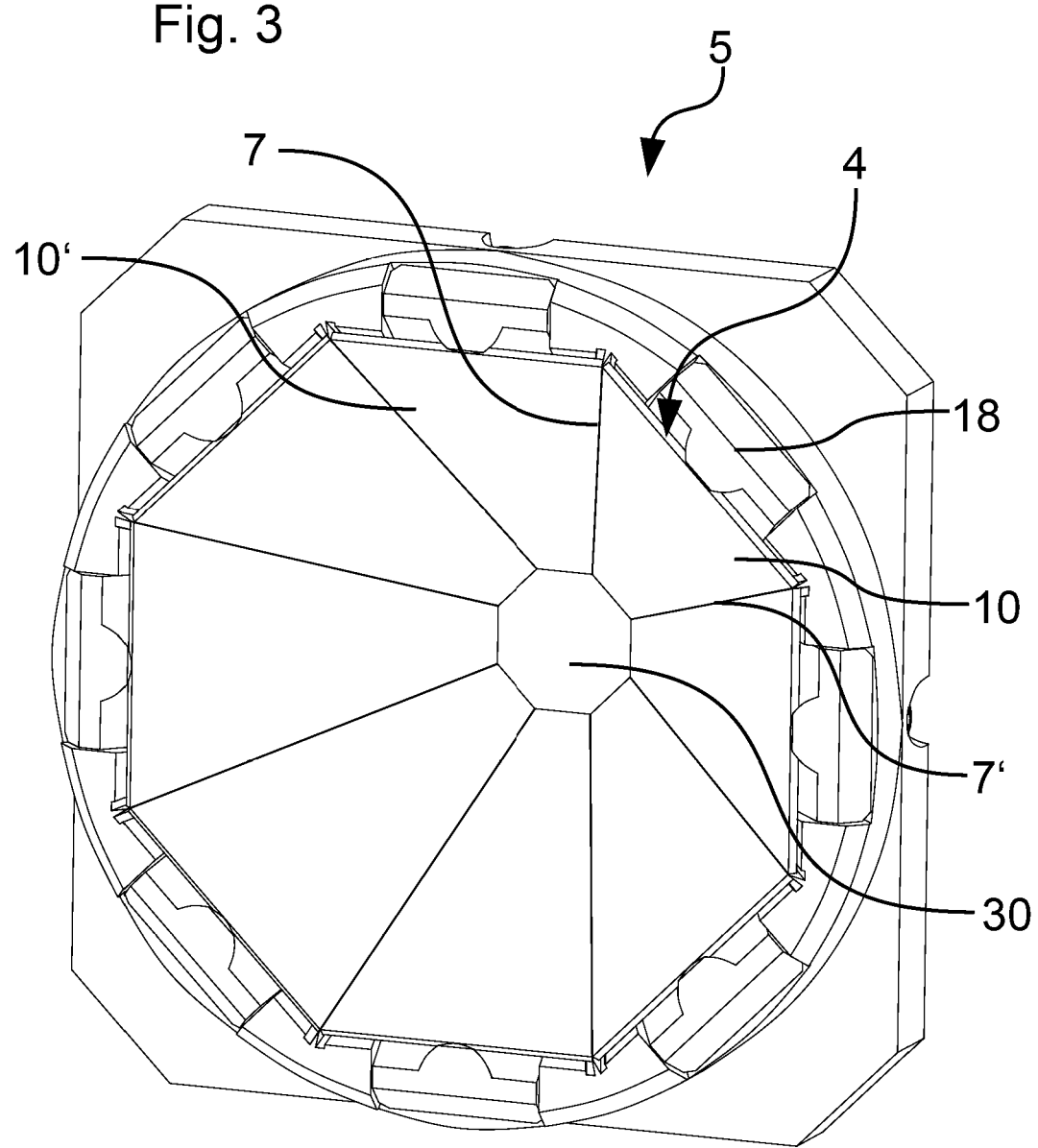
FIG. 3 shows a perspective view of the mirror apparatus of the inspection apparatus from FIG. 1 and FIG. 2, respectively.
Figure 4:
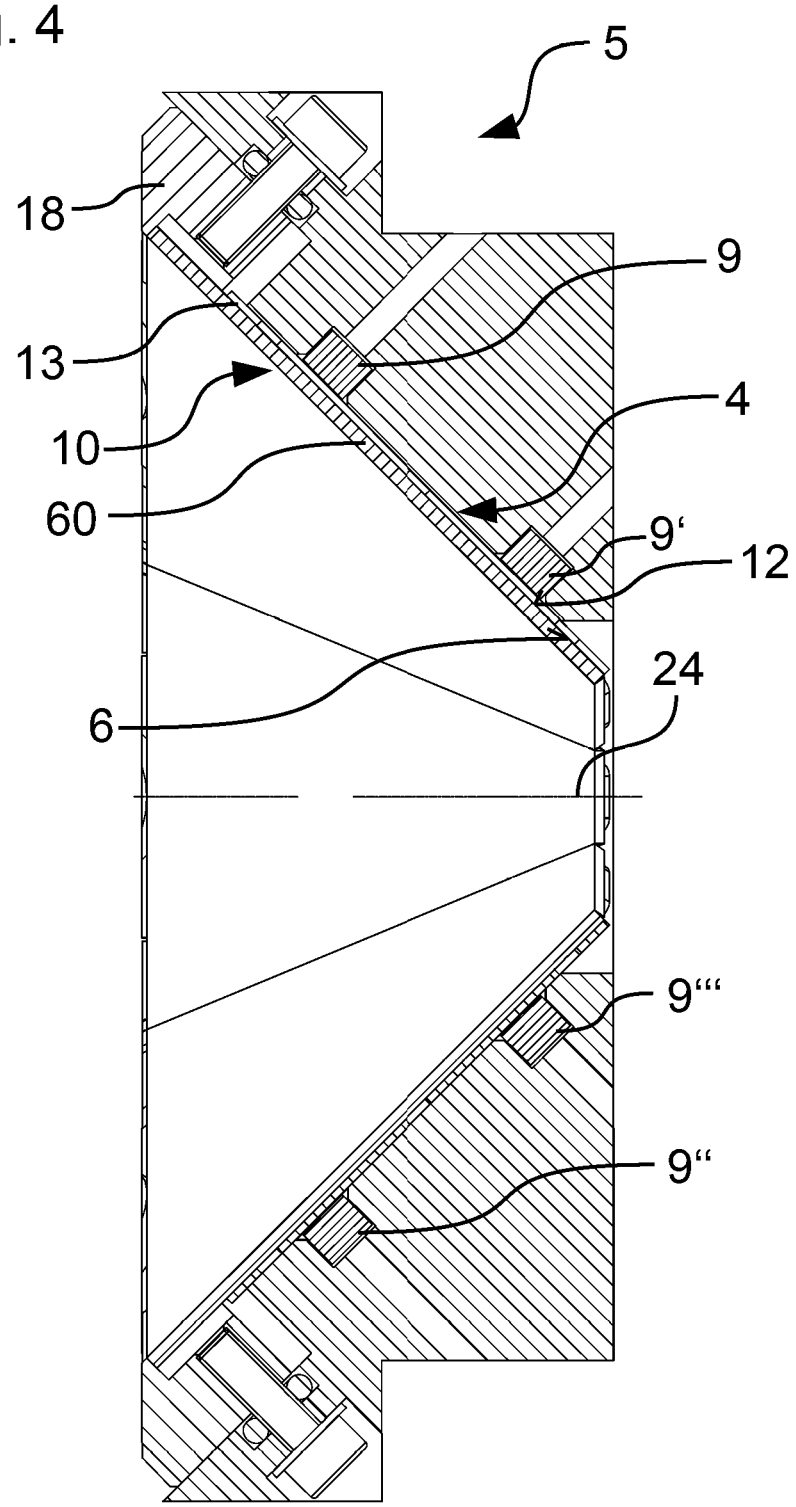
FIG. 4 shows a sectional view of the mirror apparatus from FIG. 3.

FIG. 3 shows a perspective view of the mirror apparatus 5 of the inspection apparatus 1 from FIG. 1 and FIG. 2, respectively. FIG. 4 shows a sectional view of the mirror apparatus 5 from FIG. 3. FIG. 4 shows, in particular, a sectional view along a plane that includes the central axis 24.

The mirror apparatus 5 contains a plurality of mirror elements 10, 10'. The mirror elements 10, 10' are arranged in the form of a mirror wreath. Each mirror element 10, 10' includes a plate 13 or a sheet and a mirror 60-67 attached to it. The mirror 60-67 or the surface of the mirror 60-67 is arranged parallel to the surface of plate 13 or the sheet. With its mirror back surface 12, the mirror 60-67 is partially glued to plate 13 or the sheet. In FIG. 3, the back surfaces of the mirror 12 and thus the plates 13 or sheets cannot be seen.

The mirror element 10, 10' thus does not have loose elements, but the parts of the mirror element 10, 10', i.e. mirrors 60-67 and sheet or plate 13, are fixedly glued together.

The mirror apparatus 5 can be removed from the inspection apparatus 1 and can be inserted into it again. When being inserted, the mirror apparatus 5 is aligned with alignment elements in such a way that the central axis 24 runs through the middle of the mirror arrangement or through the middle of the mirrors 60-67.

The plate 13 or the sheet has a rectangular shape in the top view. The corners of the rectangular shape can be rounded. The plate 13 or the sheet is made of a material that can be or is attracted by a magnet 9, 9', 9", 9'". The plate 13 or the sheet, for example, can consist of a ferromagnetic material. The plate 13 or the sheet can be made of metal in particular. Plastic which can be attracted by a magnet 9, 9', 9", 9'" is also conceivable as the material of the plate 13 or the sheet.

Usually, the plate 13 or sheet itself does not comprise a magnet. However, it is also possible that the plate 13 or the sheet itself is magnetic and the plate 13 or the sheet is magnetically attached to (e.g. ferromagnetic) metal of the mirror apparatus 5, wherein the mirror apparatus 5, apart from the plates 13 or sheets, has no magnets, and/or is attached magnetically to magnets of the mirror apparatus 5.

The surface of the plate 13 or the sheet which faces the mirror 60-67 has a much larger surface area than the thickness of the plate 13 or the sheet, wherein the thickness runs perpendicular to the surface of plate 13 or the sheet facing the mirror 60-67.

Eight mirror elements 10, 10' or eight mirrors 60-67 are arranged in the mirror apparatus 5, thus allowing eight different perspectives on the cable end 23.

The mirror elements 10, 10' are magnetically connected to the mirror apparatus 5 by means of the plate 13 or the sheet. The mirror apparatus 5 has magnets 9, 9', 9", 9'" for holding mirror elements 10, 10' at a predetermined position.

The mirror elements 10, 10' are designed to be identical to each other. Thus, the mirror apparatus 5 is also formed point-symmetrically with respect to a point on the central axis 24.

Figure 5:
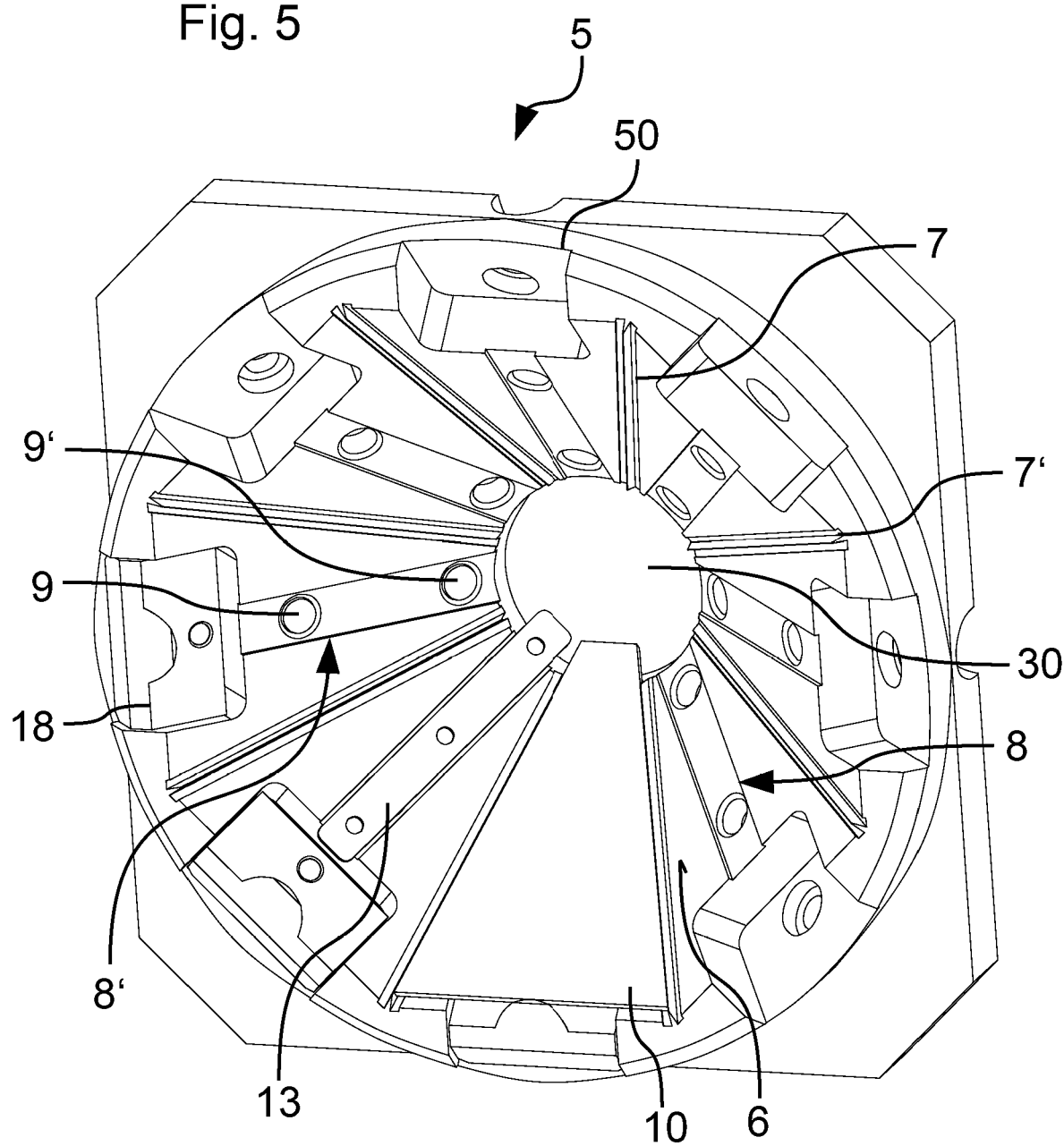
FIG. 5 shows a perspective view of the mirror apparatus from FIG. 3, without some mirrors.
Figure 6:
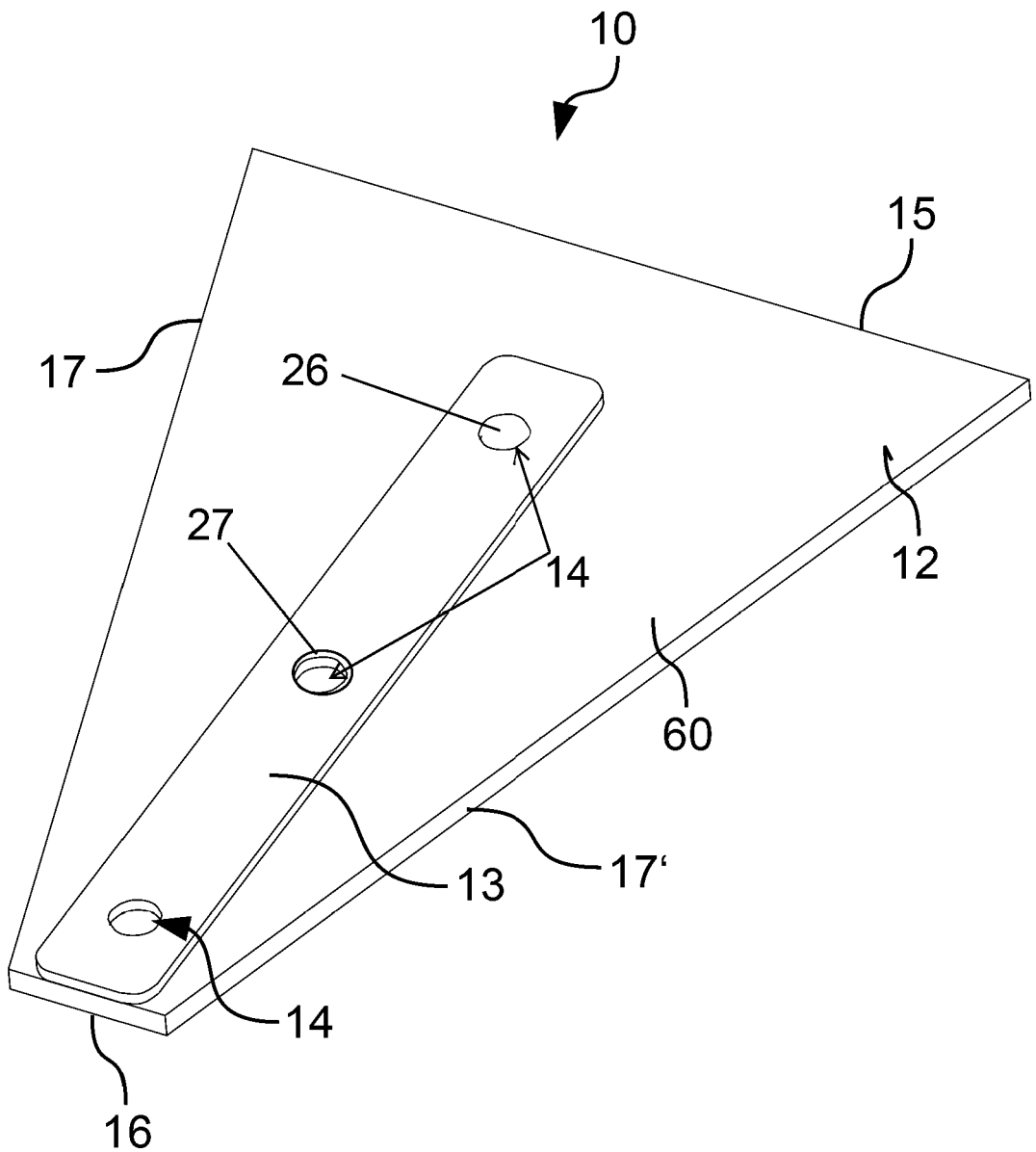
FIG. 6 shows a perspective view of a mirror element of the inspection apparatus from FIG. 1 and FIG. 2, respectively.

FIG. 5 shows a perspective view of mirror apparatus 5 from FIG. 3, without some mirrors 60-67. FIG. 6 shows a perspective view of a mirror element 10 of the inspection apparatus 1 from FIG. 1 and FIG. 2, respectively.

In FIG. 5, seven of the eight mirrors 60-67 have been removed.

Only the sheet or plate 13 of one mirror element 10 is still present. Only one mirror element 10 is fully present or arranged in the mirror apparatus 5.

The mirror apparatus 5 has a support area 6 for each of the mirrors 60-67 or their mirror back surface 12. If the mirror 60-67 or the mirror element 10, 10' is installed in the mirror apparatus 5, the majority of the mirror back surface 12 rests on a support area 6. The support area 6 runs parallel to the mirror back surface 12.

The support areas 6 are each arranged at an angle of 45° to the central axis 24. The support areas 6 also are at an angle of 45° (360°/8) to each other, in the case of eight mirrors 60-67. With more mirrors, the angle is correspondingly smaller and with fewer mirrors it is correspondingly larger.

Each of the mirrors 60-67 has a trapezoidal shape in the top view.

Each of the support areas 6 has a stop depression 50 in which a stop 18 can be arranged at its end that is turned away from central axis 24. The stop 18, when the mirror element 10, 10' is installed in the mirror apparatus 5, lies at a first end of the plate 13, with the first end of the plate 13 being at a greater distance from the central axis 24 than the second end of the first end opposed to the first end of the plate 13. The second end of the plate 13 extends into the cable receiving opening 30.

The stop 18 prevents a movement of mirror element 10, 10' away from the central axis 24. The stop 18, when the stop 18 is in a locked state, prevents a movement of the mirror element 10, 10' in a direction along the longitudinal direction of the plate 13 or the sheet (the longitudinal direction runs along the longest dimension of the plate 13 or the sheet) or parallel to the support surface 6. In particular, shifts caused by vibrations are prevented.

The stops can be moved in a non-locked state parallel to the mirror element 10, 10', i.e. the stops can be moved in a direction that runs parallel to the support area 6. After the insertion of the mirror elements 10, 10', the stops are pushed up to the mirror elements 10, 10', until they touch or contact the end of plate 13 or the sheet of the respective mirror element 10, 10' which faces away from the central axis 24. The stops are then locked or fixed in position by a screw or similar. Now the mirror elements 10, 10' can no longer be moved parallel to the support area 6 away from the central axis 24.

The support areas 6 each have a recess 8, 8'. Each recess 8, 8' runs away from the central axis 24. The recess 8, 8' is located in the middle of the support surface 6. The recess 8, 8' is designed to receive the plate 13 or the sheet of the respective mirror element 10, 10'. In the recess 8, 8', the magnets 9, 9', 9", 9'" are arranged in depressions on the support area 6 for holding the respective mirror element 10, 10'. Each recess 8, 8' has two mutually spaced depressions, in each of which a magnet 9, 9', 9", 9'" is arranged.

The magnets 9, 9', 9", 9'" may each be a permanent magnet, such as a neodymium magnet, and/or an electromagnet.

In FIG. 5, eight mirror elements 10, 10' are arranged such that the center of the mirror elements 10, 10' is arranged at the clock positions 12:00, 1:30, 3:00, 4:30, 6:00, 7:30, 9:00 and 10:30, respectively.

In FIG. 5, the lower ("at 6:00") mirror element 10 with one of the mirrors 60-67 is inserted into the mirror apparatus 5 or arranged in the mirror apparatus 5. In the case of the next support surface 6 in the clockwise direction next to the inserted mirror element 10 ("at 7:30"), only the sheet or the plate 13 of the mirror element 10' is inserted into the mirror apparatus 5. This is for illustration only. The sheet or the plate 13 is usually fixedly connected to the mirror 60-67 by means of an adhesive bond. No mirror and no plate 13 or sheet are present in the other six areas or support surfaces 6 of the mirror apparatus 5. In the case of the next support surface 6 in the clockwise direction ("at 9 o'clock"), two magnets 9, 9' are arranged in the depressions of the recess 8', and in the other areas, the magnets 9, 9', 9", 9'" are hidden by the mirror element 10 or the plate 13 or are not inserted.

Each of the mirrors 60-67 abuts, when the respective mirror element 10, 10' is inserted in the mirror apparatus 5, two obliquely extending longitudinal sides or legs 17, 17' of the trapezoidal shape of the mirror 60-67 at a respective lateral mirror boundary 7, 7'. This can be seen well in FIG. 5. Two mirror boundaries 7, 7' are arranged between adjacent support surfaces 6. The mirror boundary 7, 7' is in each case a surface which projects in each case from the edge of the support surface 6 perpendicular to the support surface 6. Between two directly mutually adjacent support surfaces 6, the mirror boundaries 7, 7' form a prismatic shape, since two directly mutually adjacent support surfaces 6 are or run at an angle to each other. Thus, there are two mirror boundaries 7, 7' between each two adjacent mirrors 60-67. Each support surface 6 is thus bounded laterally by two mirror boundaries 7, 7'.

The mirror boundaries 7, 7' prevent movement of the mirrors 60-67 in a first spatial direction or opposite to a first spatial direction, which is perpendicular to the longitudinal direction of the sheet or the plate 13 (the longitudinal direction extends along the longest dimension of the sheet or the plate 13) and runs parallel to the support surface 6. The mirror boundaries 7, 7' thus provide alignment of the mirrors 60-67 along a first spatial dimension, which is in a different direction for each mirror 60-67.

Due to the conical shape of the arrangement of the mirror elements 10, 10' or the mirrors 60-67, the mirrors 60-67 can only be displaced up to a certain point on the support surface 6 in the direction of the central axis 24. When the mirrors 60-67 abut the mirror boundaries 7, 7' with their legs 17, 17', each mirror 60-67 is in the correct position relative to the other mirrors 60-67 and the central axis 24, respectively. Subsequently, the stops 18 are moved to the side of the respective mirror 60-67 facing away from the central axis 24 and locked.

The support surface 6 aligns each of the mirrors 60-67 in a position in a second spatial direction relative to the other mirrors 60-67 and relative to the central axis 24, respectively. The second spatial direction is perpendicular to the first spatial direction. The first spatial direction is perpendicular to the longitudinal direction of the sheet or the plate 13 (the longitudinal direction extends along the longest dimension of the sheet or the plate 13) and parallel to the support surface 6. Due to the support surface 6, the mirror 60-67 in FIG. 5 cannot be displaced into the image plane, since the mirror 60-67 rests with its mirror back surface 12 on the support surface 6.

If the plate 13 or the sheet is received in the recess 8, 8', the mirror element 10, 10' is attached to the mirror apparatus 5 by the magnets 9, 9', 9", 9'" and fixed by the mirror boundaries 7, 7', the support surface 6 and the stop 18 in three substantially mutually perpendicular spatial directions or are aligned relative to the central axis 24 in a predetermined position.

The magnets 9, 9', 9'', 9''' magnetically attract the sheet or the plate 13 of the respective mirror element 10, 10'.

When the plate 13 or the sheet is received in the recess 8, 8' and the mirror back surface 12 rests largely on the support surface 6, the mirror element 10, 10' does not touch the magnets 9, 9', 9'', 9'''. The magnets 9, 9', 9'', 9''' are each at a distance of, for example, about 0.1 mm to the respective sheet or to the respective plate 13.

The plates 13, together with the mirrors 60-67, respectively protrude slightly into the cable receiving opening 30, as shown in FIG. 5 for the lower mirror 60-67.

FIG. 6 shows a perspective view of a mirror element 10 of the inspection apparatus 1 from FIG. 1 and FIG. 2, respectively.

The mirrors 60-67 are connected to the plates 13 or the sheets by one or several adhesive bonds or by adhesive. Each mirror 60-67 is glued to exactly one plate 13 or one sheet.

Each plate 13 or each sheet has one or several adhesive recesses 14. The adhesive recesses 14 of the plate 13 or the sheet are designed to receive adhesive to establish the adhesive bond between the plate 13 or the sheet and the mirror 60-67. In FIG. 6, the plate 13 or the sheet has three adhesive recesses 14 that are circular in cross-section. The two outer adhesive recesses 14 are each at an equal distance from the ends of the plate 13 or the sheet, respectively. The middle adhesive recess 14 is formed in the middle of the two outer adhesive recesses 14.

The adhesive recesses 14 run through the complete thickness of the sheet or plate 13, so that there is a cylindrical hole. The hole runs parallel to the thickness of the sheet or the plate 13.

Adhesive material is inserted in the adhesive recesses 14. See the adhesive material 26 in the upper other adhesive recess 14 shown in FIG. 6. The contact surface between the adhesive and the mirror 60-67 corresponds to the area of the diameter of the adhesive recess 14, wherein the diameter runs perpendicular to the surface of the mirror 60-67. Thus, adhesive is only on the part of the mirror back surface 12 which is only visible through the hole or the adhesive recess 14 through the sheet or the plate 13. The adhesive thus has essentially the shape of a straight/vertical circular cylinder, wherein the top of the vertical circular cylinder (i.e. the circular side of the vertical circular cylinder facing the mirror back surface 12) is the contact area between the adhesive and the mirror back surface 12. The mirror element 10 in FIG. 6 faces upward with its back side or mirror back surface 12. This means that the mirroring side or reflective side of the mirror 60 cannot be seen in FIG. 6. The mirror back surface 12 is thus only glued to the sheet or plate 13 via three small contact surfaces.

The sheet or plate 13 can have a chamfer at the end of the adhesive recess 14 facing away from the mirror 60-67. See the chamfer 27 at the end of the middle adhesive recess 14 in FIG. 6. This also secures the cured adhesive in a form-fitting manner in the sheet or the plate 13, as is known as an epoxy rivet, among other things, for attaching the rear-view mirror to the windshield of a motor vehicle. Consequently, the connection between the adhesive and the plate 13 is improved and thus the adhesive bond between plate 13 and mirror 60-67 is also improved.

Due to the small bonding/contact surface or adhesive surface between mirror 60-67 and the plate 13, even with size changes of the sheet or the plate 13 and/or the mirror 60-67 due to temperature differences, no mechanical stresses occur in the mirror 60-67. Outside the bonding/contact surface or the adhesive surface or the adhesive surfaces, the mirror 60-67 and the plate 13 or the sheet are not fixedly connected to each other.

The respective sheet or plate 13 is flush at one of its ends with the second base side 16 or the shortest of the two parallel sides of the mirror 60-67. The other end of the sheet is arranged spaced apart from the base 15 or from the longest of the two parallel sides of the mirror 60-67.

For cleaning, the mirror apparatus 5 is removed from the inspection apparatus 1 or taken from the inspection apparatus 1. The stops 18 are released or removed from the mirrors 60-67. Mirror elements 10, 10' or mirrors 60-67 can now be held at the base 15 and at the second base side 16, and mirror elements 10, 10' can now be removed from the mirror apparatus 5. This releases the magnetic connection between sheet/plate 13 and magnet(s) 9, 9', 9'', 9'''.

Mirror elements 10, 10' can be held magnetically on another magnetic mount. On the magnetic mount, the mirror elements 10, 10' can now be freed of dirt or cleaned with cleaning agents (e.g. liquid and cloth) and/or with a polymer solution for stripping off the dirt. When using the polymer solution, the dirt is absorbed and can be removed after curing as a film (possibly with the help of a carrier cloth).

Other types of cleaning of mirrors 60-67 are also conceivable.

After cleaning, the mirror elements 10, 10' are inserted again into the mirror apparatus 5. Here, the mirror elements 10, 10' are aligned through the mirror boundaries 7, 7' and the support surface 6. The mirrors 60-67 are each placed with their mirror back surface 12 on the support surface 6, while the respective sheet or the plate 13 goes into the respective recess 8, 8'. The sheet or the plate 13 of the respective mirror element 10, 10' is attracted by the magnets 9, 9', 9'', 9''', at the latest when the mirrors 60-67 each rest with their mirror back surface 12 on the support surface 6. Now a magnetic attraction prevails between the magnets 9, 9', 9'', 9''' and the mirror elements 10, 10' which must be overcome to release the mirrors 60-67 from the support surface 6 and the mirror elements 10, 10' from the mirror apparatus 5. Due to the magnets 9, 9', 9'', 9''', in particular mirror elements 10, 10' in the upper half or in the upper part of the mirror apparatus 5 (i.e. mirror elements 10, 10', in which the mirrors 60-67 are located below the support surface 6) do not fall down by gravity, rather they are held by the magnets 9, 9', 9'', 9'''. The legs 17, 17' of the trapezoidal mirrors 60-67 are pushed towards the mirror boundaries 7, 7' until the legs 17, 17' contact or touch the mirror boundaries 7, 7'. Then the stops 18 are brought to the base 15 of the mirror 60-67 and are fixed or locked. The screws of the stops 18 are preferably secured against becoming lost with an O-ring.

Without further adjustment operations, the mirrors 60-67 are now correctly and precisely arranged and aligned in the mirror apparatus 5. The mirror apparatus 5 can now be inserted into the inspection apparatus 1. The mirror apparatus 5 can be precisely aligned in the inspection apparatus 1 by alignment elements.

In a similar manner, damaged mirrors 60-67 or mirror elements 10, 10' can also be exchanged or replaced.

FIG. 7 shows an image of the cable end 23 taken with the inspection apparatus 1 from FIG. 1. In FIG. 7, it can be clearly seen how the eight mirrors 60-67 of the mirror assembly 5 provide/result in different views of the cable end 23 and the cable 40 from different viewing angles. In the reflection or mirror image of the cable end 23 of the right mirror 64 ("at 3:00") and the left mirror 60 ("at 9:00"), it can be seen particularly clearly that one of the strands of the cable 40 or the cable end 23 (at the top) is cut too short. In the other reflections or mirror images of the other mirrors 61-63, 65-67 this is harder to recognize or determine.

This non-uniformity of the strands can be detected by the evaluation software and the cable 40 is marked accordingly as faulty and/or is sorted out directly as a reject.

Other errors that can be technically easily detected or inspected by the inspection apparatus 1 include, inter alia, that a strand of the cable 40 is pulled out, that a strand of the cable 40 is splayed, that the cut performed to strip the cable 40 resulted in a stripping edge that is not straight, that the strands of the cable 40 were cut off obliquely, that a strand of the cable 40 was not crimped with a crimp contact, whether strands in a control bore of the cable 40 run parallel to each other, whether a contact element, such as a crimp, that has been connected to the cable 40, runs entirely along the central axis 24 or not (or is bent).

Finally, it should be noted that terms such as "having", "comprising", etc. do not preclude other elements or steps, and terms such as "a" or "an" do not preclude plurality. Further, it should be noted that features or steps that have been described with reference to one of the above embodiments may also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS

1 inspection apparatus
2 camera
3 lighting device
4 mirror collar
5 mirror apparatus
6 support surface
7, 7' mirror boundary
8, 8' recess
9, 9', 9", 9'" magnet
10, 10' mirror element
12 mirror back surface
13 plate
14 adhesive recess
15 base
16 second base side
17, 17' leg
18 stop
19 pane
20 compressed air cleaning apparatus
21 cable centering
22 cover
23 cable end
24 central axis
25 support base
26 adhesive
27 chamfer
30 cable receiving opening
40 cable
45 ring light
50 stop depression
60-67 mirror

What is claimed is:

1. An inspection apparatus for inspecting a cable end of a cable comprising:
a mirror apparatus with a central axis, wherein the cable end is arranged along the central axis in the mirror apparatus for inspecting the cable end;
wherein the mirror apparatus includes a plurality of mirror elements arranged at a predetermined first angle to each other and at a predetermined second angle to the central axis, each of the mirror elements having a mirror viewing the cable end arranged along the central axis from a different viewing angle;
a camera generating images of the cable end at the different viewing angles from the mirrors; and
a plurality of magnets holding at least a portion of each of the mirror elements in respective positions in the mirror apparatus.

2. The inspection apparatus according to claim 1 wherein each of the mirror elements has a plate formed of a material that is attracted by the magnets, and wherein each of the mirrors is fixedly connected to an associated one of the plates.

3. The inspection apparatus according to claim 2 wherein each of the plates is formed of at least one of a metal material and a plastic material.

4. The inspection apparatus according to claim 2 wherein the mirrors are fixedly connected to the plates by an adhesive bond.

5. The inspection apparatus according to claim 4 wherein each of the plates has at least one adhesive recess in which an adhesive of the adhesive bond is received.

6. The inspection apparatus according to claim 5 wherein the at least one adhesive recesses each include a chamfer on a side facing away from the mirror to improve bonding of the adhesive to the plate.

7. The inspection apparatus according to claim 5 wherein a size of a contact surface of the adhesive with the mirror substantially corresponds to a cross-section of the at least one adhesive recess.

8. The inspection apparatus according to claim 2 wherein the mirror apparatus includes support surfaces for resting back surfaces of the mirrors, and wherein the support surfaces each have a recess for receiving one of the plates.

9. The inspection apparatus according to claim 8 wherein each of the mirror elements is fastened to the mirror apparatus by two of the magnets, the two magnets being arranged in depressions of the recess.

10. The inspection apparatus according to claim 2 including a stop positioned on an end of each of the plates facing away from the central axis for holding the mirror elements in the respective positions in the mirror apparatus.

11. The inspection apparatus according to claim 2 wherein the plates are each arranged spaced from the magnets.

12. The inspection apparatus according to claim 2 wherein each of the mirrors has a trapezoidal shape in a top plan view, and one end of the associated plate is flush with a shorter of two mutually parallel sides of the mirror.

13. The inspection apparatus according to claim 1 wherein the mirror apparatus has a plurality of lateral mirror boundaries, and wherein the lateral mirror boundaries are arranged in predetermined positions abutting two opposite sides of each of the mirrors for holding the mirrors and preventing movement of the mirrors.

14. The inspection apparatus according to claim 1 wherein the mirror apparatus is selectively removable from the inspection apparatus and selectively insertable into the inspection apparatus.

15. The inspection apparatus according to claim 1 wherein the mirror apparatus is mirror-symmetrical with respect to the central axis.

16. A method for cleaning the mirrors of an inspection apparatus according to claim 1, the method comprising the steps of:
- removing the mirror apparatus from the inspection apparatus;
- releasing a magnetic connection between at least one of the mirror elements and the mirror apparatus and removing the at least one mirror element from the mirror apparatus;
- cleaning the mirror of the at least one mirror element;
- inserting the cleaned at least one mirror element into the mirror apparatus in the respective position and fixing the at least one mirror element on the mirror apparatus by the magnets; and
- inserting the mirror apparatus into the inspection apparatus.

17. The method according to claim 16 further comprising the step of attaching the at least one mirror element to a mirror holding apparatus by magnets to hold the at least one mirror element while cleaning the mirror.

\* \* \* \* \*